United States Patent [19]

Poklemba et al.

[11] Patent Number: 4,987,386
[45] Date of Patent: Jan. 22, 1991

[54] COHERENT PHASE AND FREQUENCY RECOVERY METHOD AND CIRCUIT

[75] Inventors: John J. Poklemba, Ijamsville; James R. Thomas, Sandy Spring, both of Md.

[73] Assignee: Communications Satellite Corporation, Washington, D.C.

[21] Appl. No.: 416,793

[22] Filed: Oct. 3, 1989

[51] Int. Cl.$^5$ ............................................. H03L 7/085
[52] U.S. Cl. ....................................... 331/10; 331/11; 331/14; 331/17; 331/25
[58] Field of Search .................... 331/10, 11, 12, 14, 331/17, 25

[56] References Cited

U.S. PATENT DOCUMENTS

| | | | |
|---|---|---|---|
| 3,878,334 | 4/1975 | Halpern | 329/122 X |
| 4,017,798 | 4/1977 | Gordy et al. | |
| 4,308,505 | 12/1981 | Messerschmitt | 331/25 |
| 4,409,562 | 10/1983 | Kurihara | 331/1 A |
| 4,456,890 | 6/1984 | Carickhoff | 331/1 A |
| 4,475,211 | 10/1984 | Mattis, Jr. et al. | 375/15 |
| 4,561,099 | 12/1985 | Atsugi et al. | 375/97 |
| 4,585,998 | 4/1986 | Viellard | 331/4 X |
| 4,594,727 | 6/1986 | Pierce | 375/83 |
| 4,612,515 | 9/1986 | Ohkawa et al. | 331/1 A |
| 4,621,366 | 11/1986 | Cain et al. | 375/8 |
| 4,628,507 | 12/1986 | Otani | 371/5 |
| 4,871,975 | 10/1989 | Nawata et al. | 331/12 X |

Primary Examiner—Siegfried H. Grimm
Attorney, Agent, or Firm—Sughrue, Mion, Zinn, Macpeak & Seas

[57] ABSTRACT

A coherent phase and frequency recovery method capable of rapidly recovering the phase and frequency of bursts of received signals from plural sources. The received signal is applied to a first input of a mixer, the output of which is amplified and applied to two feedback paths, one for frequency and the other for phase. The frequency path contains a loop filter driving a voltage-controlled oscillator, and the phase path a loop filter and amplifier. Initial estimates of the phase and frequency of the present burst are derived and injected into the respective feedback paths. The output of the phase path is applied to correct the phase of the output of the frequency path, which is then applied to a second input of the mixer.

15 Claims, 7 Drawing Sheets

PHASE AND FREQUENCY MODULATOR, 30

COHERENT PHASE AND FREQUENCY RECOVERY METHOD AND CIRCUIT

BACKGROUND OF THE INVENTION

The present invention relates to a method and a circuit for coherently recovering the phase and frequency of a received signal. More particularly, the invention relates to a method and a circuit for rapidly coherently recovering the phase and frequency of bursts of received signals from plural sources, which signals may differ from one another in frequency and phase.

Conventionally, coherent phase and frequency recovery has most often been performed with a PLL (Phase-Locked Loop) circuit, a block diagram of which is shown in FIG. 1. As shown in FIG. 1, the conventional PLL circuit is composed of a mixer 11, loop filter 12, and VCO (Voltage-Controlled Oscillator) 13 connected in a loop configuration. An input signal $\theta$ is applied to the positive input of the mixer 11, and the output of the mixer 11 is applied through the loop filter 12 to the frequency-control input terminal of the VCO 13. The output of the VCO is connected back to the negative input of the mixer 11. As is well known, when a new input signal $\theta$ is applied to this circuit, if the frequency and/or phase of the input signal $\theta$ differ from those of the output of the VCO 13 (and they are within the pull range of the circuit), the resulting output of the loop filter 12 will drive the VCO 13 in the direction to cause the output of the VCO to follow the input signal $\theta$ in frequency and phase.

The PLL circuit of FIG. 2 can be modeled by the nonlinear phase parameter control system shown in FIG. 2. In this model, the VCO is represented as an integrator having a transfer function $K_0/s$, and the mixer 11 by an adder 14 and a block having a transfer function $K_d \cdot \sin(s)$. The loop filter has a transfer function $F(s)$.

To achieve phase lock with an incoming signal of arbitrary phase, the output phase estimate $\hat{\theta}$ from the integrator must change to approximate the value of the phase of the input signal $\theta$. When a new input signal $\theta$ is applied, it is represented in the model of FIG. 2 by a step change in input phase. For the VCO to instantaneously follow a step change, it must be driven by an impulse, which requires a very large bandwidth. This results in two fundamental and inherent problems.

First, for applications that employ a crystal-controlled VCO with a relatively narrow pull range, it is generally difficult, if not impossible, to prevent the VCO input from saturating at wide recovery loop bandwidths. In addition, if the input SNR (Signal-to-Noise Ratio) is not sufficiently large, the wider bandwidth will yield a poorer acquisition reliability. That is, the probability of missing acquisition and falsely detecting acquisition are limited by what is termed the "hangup" phenomenon. In general, the lower the SNR, the greater the chance hangup will occur.

Consequently, an alternate circuit arrangement that eliminates the PLL so as to avoid the hangup phenomenon while maintaining a moderate acquisition bandwidth is often needed. For this purpose, a tuned filter is sometimes used. A tuned filter, however, has the disadvantage that if there is a frequency offset in the incoming signal, a phase error in the output estimate will result.

SUMMARY OF THE INVENTION

Accordingly, it is an object of the present invention to provide a coherent phase and frequency recovery method and circuit in which the above-discussed disadvantages are eliminated.

More specifically, it is an object of the present invention to provide a coherent phase and frequency recovery method and circuit capable of producing an output signal which is rapidly locked in phase and frequency with incoming signal bursts of varying phase and frequency.

In accordance with the above and other objects of the present invention, a coherent phase and frequency recovery method and circuit are provided in which phase and frequency control signals are processed separately in a dual path feedback loop. A phase correction signal is directly injected as an output phase estimate into the phase path of the feedback loop, bypassing the integrator in the frequency path. Acquisition reliability is enhanced by presetting the initial phase and frequency of the VCO to closely match the incoming signal.

DESCRIPTION OF THE PREFERRED EMBODIMENTS

Preferred embodiments of the invention will now be described with reference to the attached drawings.

Figure 1:
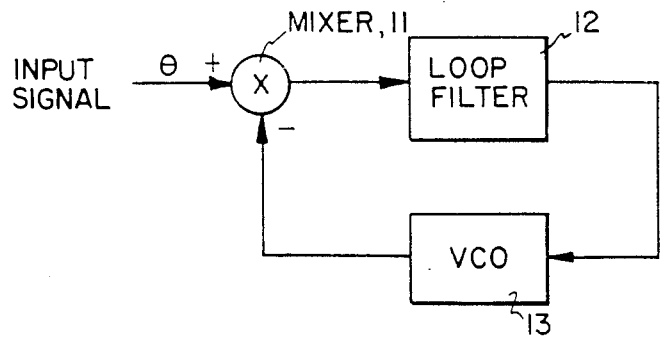
FIG. 1 is a block diagram of a conventional PLL circuit.
Figure 2:
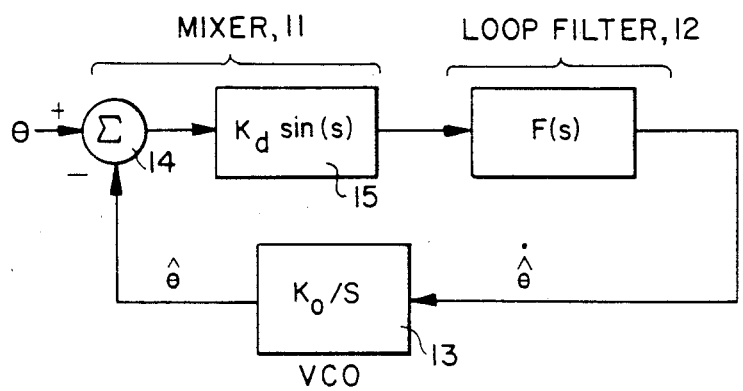
FIG. 2 is a diagram showing a nonlinear phase parameter model of the PLL circuit of FIG. 1.
Figure 3:
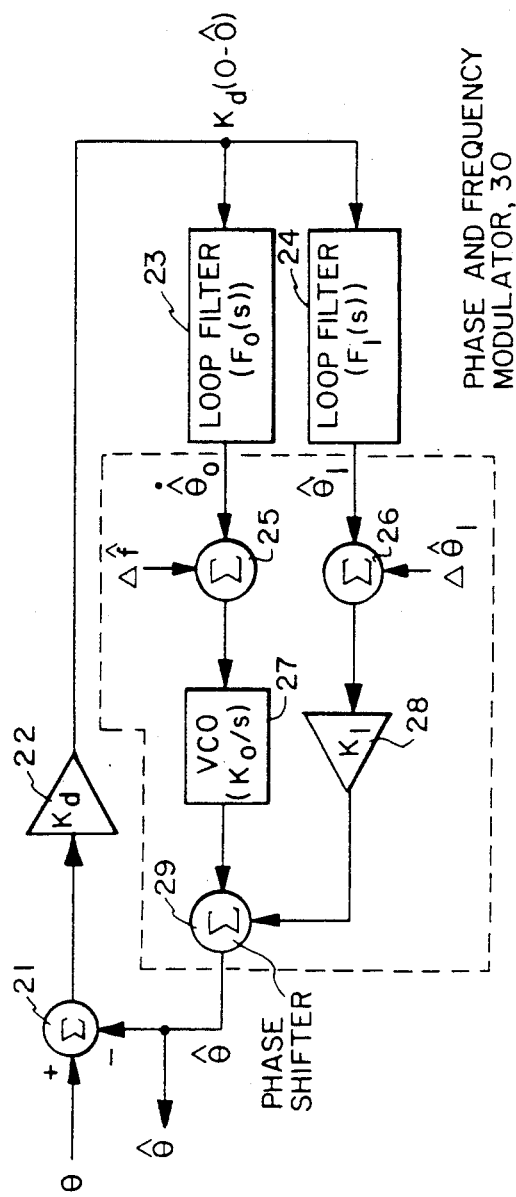
FIG. 3 is a diagram of a model of a coherent phase and frequency recovery circuit of the present invention.

FIG. 3 is a diagram showing a transfer function representation of a coherent phase and frequency recovery circuit constructed in accordance with the invention.

In the coherent phase and frequency recovery circuit of FIG. 3, the input signal $\theta$ is differenced at 21 with the loop output signal $\hat{\theta}$. The difference signal is multiplied by a gain factor $K_d$ in an amplifier 22, and the resulting signal $K_d(\theta - \hat{\theta})$ is applied to the inputs of two loop filters 23 and 24 having respective transfer functions $F_0(s)$ and $F_1(s)$. The output $\dot{\theta}_0$ of the loop filter 23 is summed at 25 with an initial frequency estimate $\Delta \hat{f}$. The resulting sum signal is integrated by an integrator (VCO) 27 having a transfer function $K_0/s$. The integrated signal, which contains the frequency information of the loop output signal $\hat{\theta}$, is applied to the signal input of a phase-shift network 29, represented in this transfer function diagram as a summation point. Of course, in an actual circuit implementation, the summation point would be implemented as indicated in the circuit shown in FIG. 4.

A parallel loop is formed by the path composed of the loop filter 24, the summation point 26, and amplifier 28. The output $\hat{\theta}_1$ of the loop filter 24 is summed at 26 with an initial estimate $\Delta\hat{\theta}_1$ of the phase of the input signal, the sum signal is multiplied by a factor $K_1$ in an amplifier 28, and the resulting signal, which contains the phase information for the loop output signal $\hat{\theta}$, is coupled to the phase-control input of the phase-shift network 29.

In the above-described circuit, the frequency control signal produced at the summation point 25 is integrated by the integrator 27 to produce a signal having the proper output frequency but with arbitrary phase. On the other hand, the phase control signal applied to the phase control input of the phase shift network sets the phase of the above signal such that the net output phase closely matches that of the incoming signal. If the phase-shift network has a very fast response time, synchronization is nearly instantaneous when the initial phase offset $\Delta\hat{\theta}$ is accurately predicted or measured (as will be described in more detail below).

Thus, with the coherent phase and frequency recovery circuit of the invention, the frequency and phase information for the loop output signal are derived separately and then combined to produce the latter signal. As will be explained in more detail below, this approach achieves rapid locking onto the input signal while substantially eliminating any danger of false locking.

Figure 4:
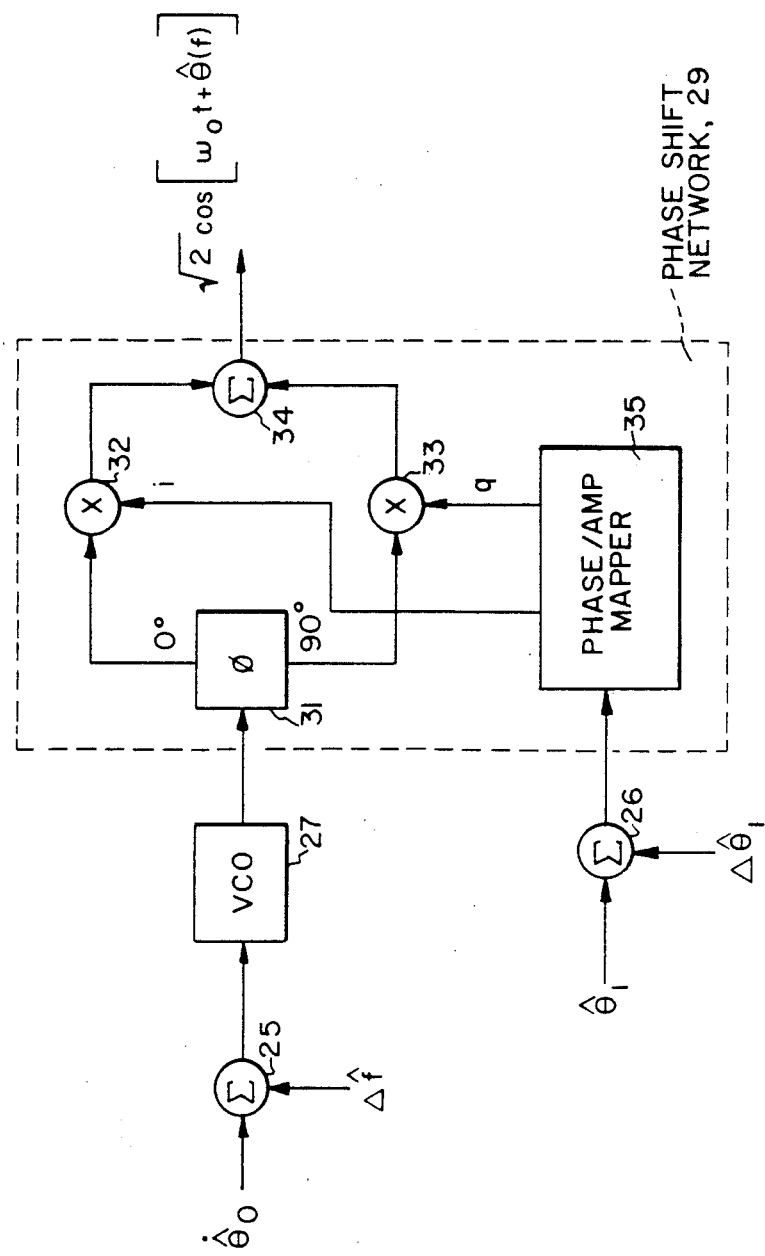
FIG. 4 is a block diagram of a phase and frequency modulator used in the coherent phase and frequency recovery circuit of FIG. 3.

The summation points 25 and 26, the integrator (VCO) 27, and the phase-shift network 29 together form a phase and frequency modulator, which is shown in more detail in the block diagram of FIG. 4. More specifically, the phase-shift network 29 includes a quadrature phase splitter 31 which divides the output of the VCO 27 into in-phase (0°) and quadrature (90°) components, which are coupled to inputs of respective mixers 32 and 33. The phase control signal drives a phase-to-amplitude mapper 35, the i and q outputs of which are applied to the second inputs of the mixers 32 and 33. The phase splitter 31, the mixers 32 and 33, and the signal summer 34 can be implemented with RF hybrids having a bandwidth of the order of several hundred megahertz. The outputs of the mixers 32 and 33 are summed at 34 to produce the loop output signal. The phase-to-amplitude mapper 35 amplitude-weights the quadrature sinusoidal outputs from the VCO 27 with cosine and sine weighting functions, as shown in Table 1 below:

TABLE 1

| Phase Offset | In-Phase Amplitude (i) | Quadrature Amplitude (q) |
|---|---|---|
| 0 | 1.0000 | 0.0 |
| 30 | 0.8660 | 0.5000 |
| 45 | 0.7071 | 0.7071 |
| 60 | 0.5000 | 0.8660 |
| 90 | 0.0 | 1.0000 |
| 135 | −0.7071 | 0.7071 |
| 180 | −1.000 | 0.0 |
| −135 | −0.7071 | −0.7071 |
| −90 | 0.0 | −1.0000 |
| −45 | 0.7071 | −0.7071 |

In the circuit of FIG. 3, if the initial estimates $\Delta\theta$ and $\Delta f$ for phase and frequency are reasonably accurate, the model can be linearized with the following approximation:

$$K_d \cdot \sin(\theta - \hat{\theta}) \approx K_d(\theta - \hat{\theta}) \tag{1}$$

Further, with appropriate selection of the parameters of the loop filters 23 and 24 ($F_0(s)$ and $F_1(s)$, respectively), the closed-loop response of the circuit of FIG. 3 can be made the same as that of a conventional second-order PLL. To compute the parameters of the loop filters 23 and 24, with the initial offsets $\Delta\hat{\theta}$ and $\Delta f$ set to zero, the closed-loop transfer function is:

$$\frac{\hat{\theta}(s)}{\theta(s)} = \frac{K_d K_0 F_0(s) + s K_d K_1 F_1(s)}{K_d K_0 F_0(s) + s[1 + K_d K_1 F_1(s)]} \tag{2}$$

Substituting $F_0(s)=1$ and $F_1(s)=1/(1+s\tau_1)$ into equation (2) gives:

$$\frac{\hat{\theta}(s)}{\theta(s)} = \frac{1 + s(\tau_1 + K_1/K_0)}{1 + s(\tau_1 + K_1/K_0 + 1/K_d K_0) + s^2(\tau_1/K_d K_0)} \tag{3}$$

The transfer function of a conventional second order PLL can be written as:

$$\frac{\hat{\theta}(s)}{\theta(s)} = \frac{1 + s(2\xi/\omega_n - 1/K_d K_0)}{1 + s(2\xi/\omega_n) + s^2(1/\omega_n^2)} \tag{4}$$

Setting equation (3) equal to equation (4) yields the design equations in terms of the parameters of the standard second order PLL system:

$$\tau_1 = \frac{K_d K_o}{\omega_n^2} \tag{5a}$$

$$K_1 = \frac{K_0}{\omega_n}\left(2\xi - \frac{K_d K_o}{\omega_n} - \frac{\omega_n}{K_d K_0}\right) \tag{5b}$$

Using these parameters, the dual path phase and frequency loop of the present invention is precisely equivalent to the conventional PLL with respect to the steady state. This is advantageous in that the conventional PLL can be demonstrated to be the optimum minimum mean-square error tracking configuration for an unmodulated carrier. In addition, for acquisition of an incoming signal burst, the circuit of the invention exhibits a nearly instantaneous response due to the injection of the initial phase offset into the output estimate.

The initial phase and frequency estimation procedure to produce the initial phase and frequency estimates $\hat{\theta}_1$ and $\hat{\theta}_0$, respectively, will now be described.

There are two methods available for determining the initial phase and frequency offset. In accordance with the first method, the estimates are predicted in a statistically adaptive manner based on information collected from previous transmission bursts from the various input signal sources. In accordance with the second method, the initial estimates are derived at the beginning of each burst in an open-loop fashion. Also, it is possible to combine these two approaches.

Figure 5:
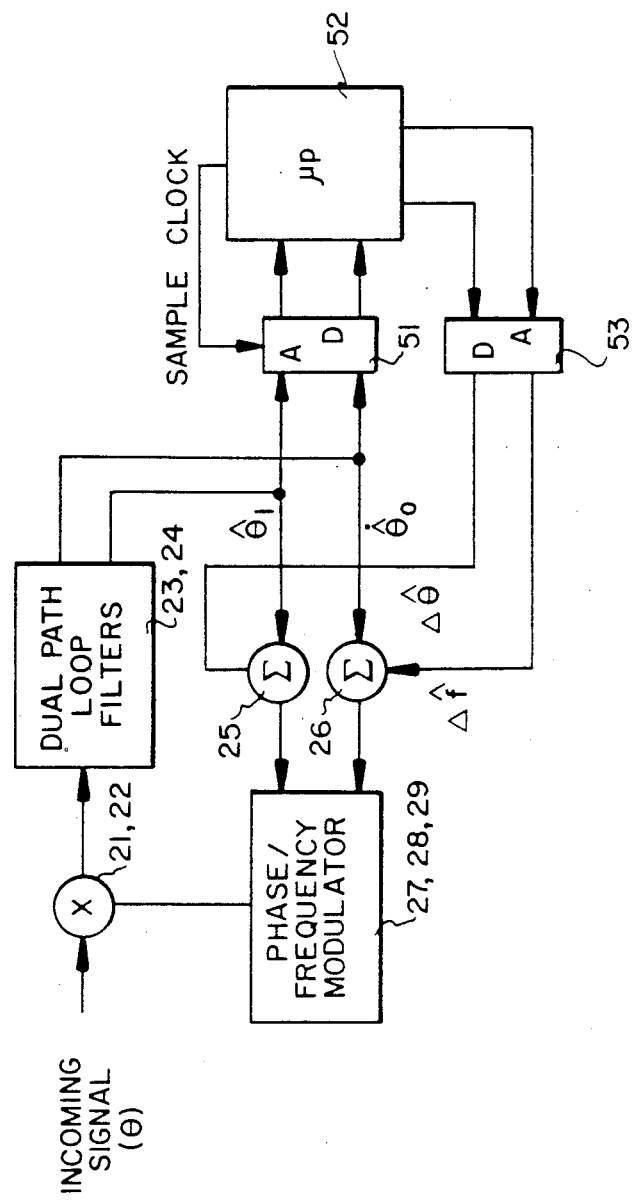
FIG. 5 is a block diagram of an apparatus used for deriving initial phase and frequency estimates.

A block diagram of an arrangement for determining the estimates in accordance with the first method is shown in FIG. 5. In this approach, the phase and frequency estimates, $\hat{\theta}_1$ and $\hat{\theta}_0$, respectively, from the outputs of the dual path loop filters 23 and 24 (FIG. 3) are sampled and converted to digital form by an analog-to-digital converter 51 and the samples applied to a microprocessor 52. The microprocessor 52 formulates predictions of the initial phase and frequency offsets, $\Delta\hat{\theta}$ and $\Delta\hat{f}$, respectively, for future bursts. The predictions are converted to analog form by a digital-to-analog converter 53 and then added to their respective loop control signals as described above.

Figure 6:
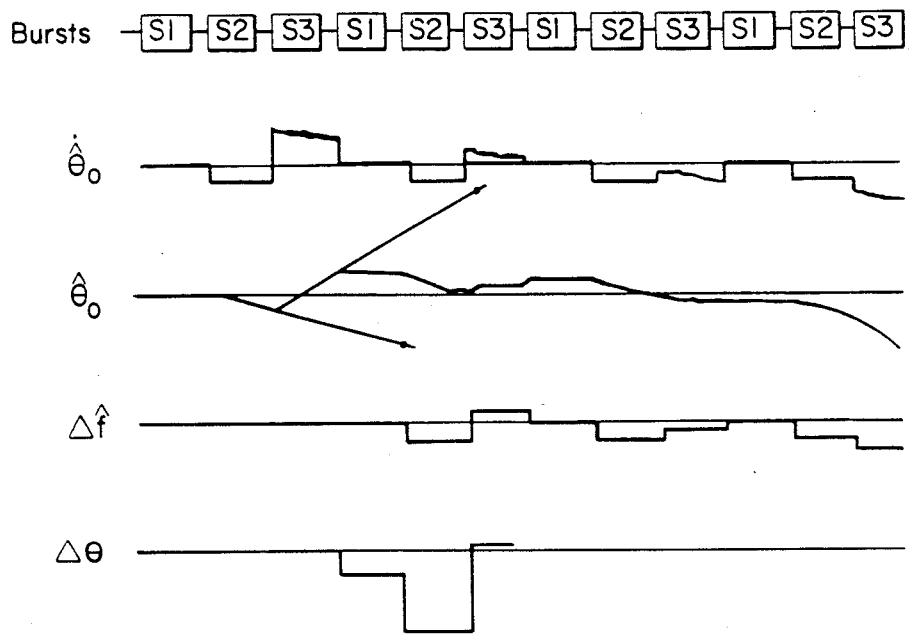
FIG. 6 is a timing diagram used to explain the operation of the apparatus of FIG. 5.

A timing diagram for this case is shown in FIG. 6. The first line in FIG. 6 shows a hypothetical series of bursts from three stations S1, S2 and S3. Station S1 is assumed to be transmitting on frequency, Station S2 below frequency, and Station S3 above frequency and drifting low. The resultant frequency control voltage $\dot{\theta}_0$ has an instantaneous level proportional to the amount of frequency offset of the incoming bursts, as shown on the second line in FIG. 6. The uncorrected phase variations $\theta_0$ of the VCO are related to the integral of the control voltages, as depicted in the third line. Straight-line projections of the phase estimate for the next burst occurrences are also shown for the first three bursts. This information is used by the microprocessor 52 in conjunction with the current value of the local oscillator phase to predict the initial phase offset for the next burst from the same stations. Higher-order projections than linear are also possible. The resulting initial frequency and phase estimates, $\Delta\hat{f}$ and $\Delta\hat{\theta}$, respectively, are shown in the third and fourth lines of FIG. 6, where $\Delta\hat{\theta}$ is equal to the difference between the actual phase and the predicted phase. It should be noted that the burst timing information is required by the microprocessor 52 to store past information and to preset the initial estimates. The microprocessor 52 also should restrict the initial phase estimate to $\pm 180°$ by subtracting out modulo 360° corrections. The integration constant should be appropriately selected to prevent overflow for the worst-case frequency offset.

Figure 7:
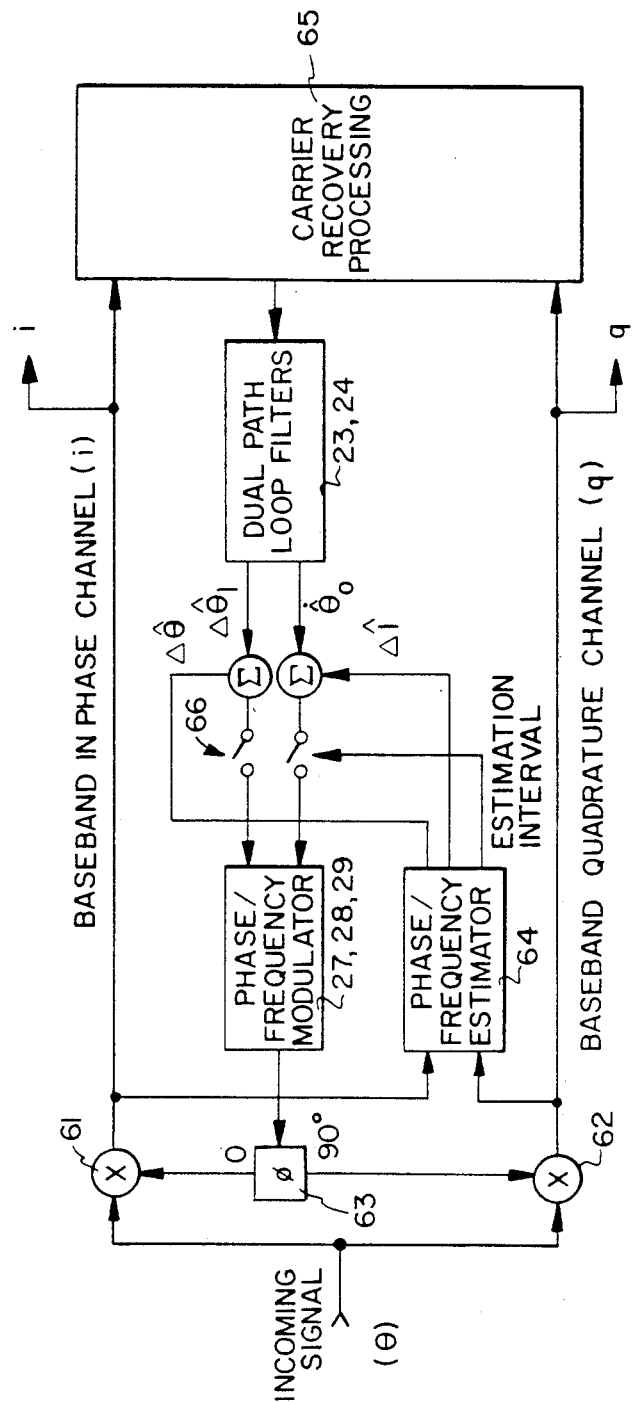
FIG. 7 is a block diagram of another apparatus for deriving initial phase and frequency estimates.

An arrangement for implementing the second method discussed above, that is, the open-loop approach, is illustrated in FIG. 7. The baseband outputs of two mixers 61 and 62 in phase quadrature with a phase shifter 63 are applied to a carrier recovery processing circuit 65 which produces the signals for driving the dual path loop filters 23 and 24. The baseband outputs of the two mixers 61 and 62 are also applied to a phase/frequency interval estimator 64. At the end of a predetermined estimation interval, a switch 66 is closed to thereby close the loop through the loop filters 23 and 24, and the initial phase and frequency estimates are injected into the phase/frequency modulator to thus minimize the lock-up transient.

Although suitable constructions of the phase/frequency estimator 64 and the carrier recovery processing circuit 65 are known and the details thereof do not form a part of the present invention, specific examples will be briefly discussed.

Figure 8:
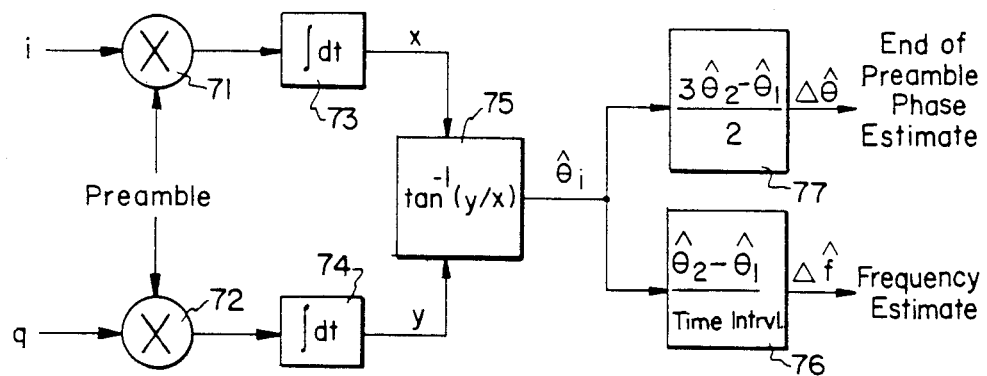
FIG. 8 is a block diagram showing an example of a phase/frequency estimator used in the apparatus of FIG. 7.

FIG. 8 is a diagram showing a possible construction of the phase-frequency estimator 64. The baseband i and q inputs are each multiplied by a preamble pattern in multipliers 71 and 72 to remove preamble data modulation. The resulting signals are integrated by integrators 73 and 74 to smooth noise fluctuations contained therein and then subjected to an inverse tangent operation in a circuit 75 to yield an estimate of the carrier phase error. The preamble is divided into two estimation intervals such that two consecutive phase estimates $\hat{\theta}_2$ and $\hat{\theta}_1$ are generated. The frequency estimate $\Delta\hat{f}$, computed in an arithmetic circuit 76, is proportional to the phase difference $\hat{\theta}_2-\hat{\theta}_1$ divided by the time interval between $\hat{\theta}_2$ and $\hat{\theta}_1$. The phase estimate $\Delta\hat{\theta}$ at the end of the preamble is computed in an arithmetic circuit 77 as $(3\cdot\hat{\theta}_2-\hat{\theta}_1)/2$.

Figure 9:
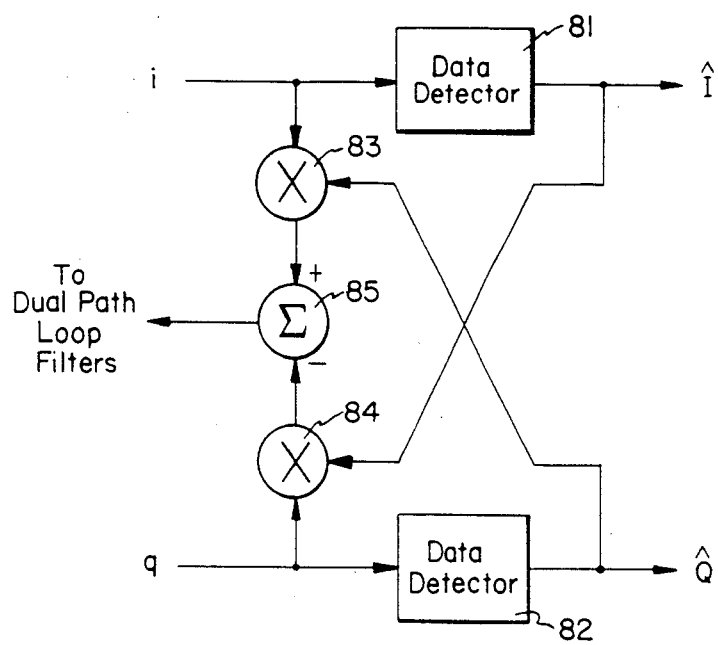
FIG. 9 is a block diagram of an example of a carrier recovery processor circuit used in the apparatus of FIG. 7.

An example of the carrier recovery processing circuit 65 is shown in FIG. 9. The baseband i and q signals are each split into two paths: one for data detection by data detectors 81 and 82, and the other for computing the carrier phase error for processing through the dual path loop filter 23 and 24. The post-detected signals on the outputs of the data detectors 81 and 82 are fed back and cross-multiplied with i and q by multipliers 83 and 84, and differenced by a subtractor circuit 85 to yield the carrier phase error, which is applied to the dual path loop filters 23 and 24.

This completes the description of the preferred embodiments of the invention. Although preferred embodiments have been described, it is believed that numerous modifications and alterations thereto would be apparent to one of ordinary skill in the art without departing from the spirit and scope of the invention.

What is claimed is:

1. A method for recovering the phase and frequency of a received signal, comprising the steps of:
providing a feedback loop circuit having an input terminal, mixer means having a first input coupled to said input terminal, amplifier means having an input coupled to an output of said mixer means and first and second parallel feedback paths having inputs connected to an output of said amplifier means for recovering said phase and frequency, respectively, of said received signal, an output of said second feedback path being applied to a second input of said mixer means, and said output of said second feedback path being phase-corrected by an output of said first feedback path to produce a signal substantially equal in phase and frequency to said received signal; and
injecting initial estimates of said phase and frequency of said received signal into said first and second feedback paths, respectively, to rapidly move the phase and frequency of said output of said second feedback path toward the frequency and phase of said received signal.

2. A method for recovering the phase and frequency of a received signal, comprising the steps of:
applying the received signal to a first input terminal of mixer means;
amplifying an output of said mixer means;
producing a frequency control signal in response to said received signal and the amplified output of said mixer means;
applying said frequency control signal to an input of a voltage-controlled oscillator to produce at an output of said voltage-controlled oscillator an oscillator signal having a frequency substantially equal to said frequency of said received signal but of arbitrary phase;
producing a phase control signal in response to said received signal and the amplified output of said mixer means;
correcting a phase of said oscillator signal with said phase control signal to produce a loop output signal; and
applying said loop output signal to a second input of said mixer means.

3. The method of claim 2, wherein said step of producing said frequency control signal comprises:
passing the amplified output of said mixer means through a first loop filter;

producing an initial frequency estimate of said received signal; and summing an output of said first loop filter with said initial frequency estimate.

4. The method of claim 3, wherein said step of producing said phase control signal comprises:

passing the amplified output of said mixer means through a second loop filter;

producing an initial phase estimate of said received signal; and summing an output of said second loop filter with said initial phase estimate.

5. The method of claim 4, wherein said step of correcting a phase of said oscillator signal with said phase control signal to produce a loop output signal comprises phase shifting said oscillator signal with said phase control signal.

6. The method of claim 4, wherein said steps of producing said initial frequency and phase estimates comprises extrapolating a frequency and a phase, respectively, of an earlier-recovered signal burst from the same source as said received signal.

7. A circuit for recovering the phase and frequency of a received signal, comprising:

a feedback loop having an input terminal, mixer means having a first input coupled to said input terminal, amplifier means having an input coupled to an output of said mixer means, first and second parallel feedback paths having inputs connected to an output of said amplifier means for recovering said phase and frequency, respectively, of said received signal, an output of said second feedback path being coupled to a second input of said mixer means, and means for phase-correcting said output of said second feedback path with an output of said first feedback path to produce a signal substantially equal in phase and frequency to said received signal; and means for injecting into said first and second feedback paths initial estimates of said phase and frequency, respectively, to rapidly move the phase and frequency of said output of said second feedback path toward the frequency and phase of said received signal.

8. A circuit for recovering the phase and frequency of a received signal, comprising:

mixer means, said received signal being applied to a first input of said mixer means;

means for amplifying an output of said mixer means;

means for producing a frequency control signal in response to said received signal and an output of said amplifying means;

voltage-controlled oscillator means for receiving said frequency control signal to produce an oscillator signal having a frequency substantially equal to said frequency of said received signal but of arbitrary phase;

means for producing a phase control signal in response to said received signal and an output of said amplifying means; and means for correcting a phase of said oscillator signal with said phase control signal to produce a loop output signal, said loop output signal being applied to a second input of said mixing means.

9. The circuit of claim 8, wherein said means for producing said frequency control signal comprises:

a first loop filter, said output of said amplifying means being applied to an input of said first loop filter;

means for producing an initial frequency estimate of said received signal; and means for summing an output of said first loop filter with said initial frequency estimate.

10. The circuit of claim 9, wherein said means for producing said phase control signal comprises:

a second loop filter, said output of said amplifying means being applied to an input of said second loop filter;

means for producing an initial phase estimate of said received signal; and means for summing an output of said second loop filter with said initial phase estimate.

11. The circuit of claim 10, wherein said means for correcting a phase of said oscillator signal with said phase control signal to produce a loop output signal comprises means for phase shifting said oscillator signal with said phase control signal.

12. The circuit of claim 11, wherein said phase shifting means comprises:

a quadrature phase splitter for dividing said oscillator signal into signals in phase quadrature with one another;

a pair of mixers, said signals in phase quadrature being applied to first inputs of respective ones of said pair of mixers;

a phase-to-amplitude mapper for producing sine and cosine weighting functions in response to said phase control signal, said sine and cosine weighting functions being applied to second inputs of respective ones of said pair of mixers; and a signal summer for summing outputs of said pair of mixers.

13. The circuit of claim 11, wherein said means for producing said initial frequency and phase estimates comprises means for predicting said estimates in a statistically adaptive manner based on information collected from previous transmissions bursts from a plurality of input signal sources.

14. The circuit of claim 11, wherein said means for producing said initial frequency and phase estimates comprises means for extrapolating a frequency and a phase, respectively, of an earlier-recovered signal burst from the same source as said received signal.

15. The circuit of claim 11, wherein said received signal contains a series of bursts, and said means for producing said initial frequency and phase estimates comprises open-loop circuit means operating in response to said received signal for deriving said initial estimates at the beginning of each of said bursts.

* * * * *